(12) United States Patent
Tani

(10) Patent No.: US 11,380,837 B2
(45) Date of Patent: Jul. 5, 2022

(54) PIEZOELECTRIC DEVICE AND METHOD FOR MANUFACTURING PIEZOELECTRIC DEVICE

(71) Applicant: Murata Manufacturing Co., Ltd., Nagaokakyo (JP)

(72) Inventor: Shinsuke Tani, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 1123 days.

(21) Appl. No.: 15/948,113

(22) Filed: Apr. 9, 2018

(65) Prior Publication Data

US 2018/0226562 A1 Aug. 9, 2018

Related U.S. Application Data

(63) Continuation of application No. PCT/JP2016/080203, filed on Oct. 12, 2016.

(30) Foreign Application Priority Data

Oct. 27, 2015 (JP) .............................. JP2015-210907

(51) Int. Cl.
*H01L 41/083* (2006.01)
*H01L 41/23* (2013.01)
(Continued)

(52) U.S. Cl.
CPC .......... *H01L 41/083* (2013.01); *H01L 41/053* (2013.01); *H01L 41/0533* (2013.01);
(Continued)

(58) Field of Classification Search
CPC . H01L 41/083; H01L 41/053; H01L 41/0477; H01L 41/1873
See application file for complete search history.

(56) References Cited

U.S. PATENT DOCUMENTS 7,605,522 B2 10/2009 Yamamoto et al.
9,440,259 B2 9/2016 Miyoshi
(Continued)

FOREIGN PATENT DOCUMENTS

CN 101510021 A 8/2009
EP 0793120 A1 9/1997
(Continued)

OTHER PUBLICATIONS

Epoxy Technology Inc.: Tech Tip 25 "Dielectric Properties of Epoxies" (2014). http://www.epotek.com/site/files/Techtips/pdfs/Tech_Tip_25_-_Dielectric_Properties_of_Epoxies, retrieved Nov. 16, 2020.
(Continued)

*Primary Examiner* — Bryan P Gordon
(74) *Attorney, Agent, or Firm* — ArentFox Schiff LLP

(57) ABSTRACT

A piezoelectric device that includes a sintered body in which a first conductor portion and a second conductor portion are disposed on both principal surfaces of a piezoelectric ceramic base body. The first conductor portion includes conductive films having a predetermined pattern. An insulating film is formed on the principal surface of the piezoelectric ceramic base body on which the conductive films are disposed such that portions of the conductive films are exposed therethrough. The insulating film has a malleability equal to or greater than that of the conductive films.

20 Claims, 9 Drawing Sheets

(51) Int. Cl.
*H01L 41/053* (2006.01)
*H01L 41/331* (2013.01)
*H01L 41/332* (2013.01)
*H01L 41/047* (2006.01)
*H01L 41/09* (2006.01)
*H01L 41/187* (2006.01)

(52) U.S. Cl.
CPC ............ *H01L 41/23* (2013.01); *H01L 41/331* (2013.01); *H01L 41/332* (2013.01); *H01L 41/0474* (2013.01); *H01L 41/0477* (2013.01); *H01L 41/094* (2013.01); *H01L 41/1873* (2013.01)

(56) References Cited

U.S. PATENT DOCUMENTS

| | | | | |
|---|---|---|---|---|
| 2005/0253270 | A1* | 11/2005 | Sasaki | H01L 41/0477 257/758 |
| 2007/0267948 | A1* | 11/2007 | Feltz | H01L 41/43 156/89.18 |
| 2008/0074004 | A1 | 3/2008 | Yamamoto et al. | |
| 2009/0207348 | A1 | 8/2009 | Hashimoto | |
| 2012/0007927 | A1* | 1/2012 | Nakayama | B41J 2/14233 310/365 |
| 2012/0112313 | A1* | 5/2012 | Tani | H01L 23/5252 257/530 |
| 2014/0176646 | A1* | 6/2014 | Hirai | H01L 41/0475 29/25.35 |
| 2016/0008852 | A1 | 1/2016 | Miyoshi | |

FOREIGN PATENT DOCUMENTS

| | | |
|---|---|---|
| EP | 2765621 A1 | 8/2014 |
| EP | 2774763 A1 | 9/2014 |
| JP | 2012033866 A | 2/2012 |
| JP | 2013141330 A | 7/2013 |
| JP | 2015109627 A | 6/2015 |
| JP | 2016042559 A | 3/2016 |
| WO | 2006129434 A1 | 12/2007 |
| WO | 2009007447 A2 | 1/2009 |
| WO | 2013042658 A1 | 3/2013 |
| WO | 2015166914 A1 | 11/2015 |

OTHER PUBLICATIONS

International Search Report issued for PCT/JP2016/080203, dated Dec. 13, 2016.
Written Opinion of the International Searching Authority issued for PCT/JP2016/080203, dated Dec. 13, 2016.

* cited by examiner (a)

(b)

(a)        (b)        (c)

(a)

(b)

(c)

(a)

(b)

(c)

PIEZOELECTRIC DEVICE AND METHOD FOR MANUFACTURING PIEZOELECTRIC DEVICE

CROSS REFERENCE TO RELATED APPLICATIONS

The present application is a continuation of International application No. PCT/JP2016/080203, filed Oct. 12, 2016, which claims priority to Japanese Patent Application No. 2015-210907, filed Oct. 27, 2015, the entire contents of each of which are incorporated herein by reference.

FIELD OF THE INVENTION

The present invention relates to a piezoelectric device and a method for manufacturing a piezoelectric device, and more particularly, relates to a piezoelectric device including a very thin piezoelectric ceramic base body and a method for manufacturing the same.

BACKGROUND OF THE INVENTION

Today, piezoelectric devices composed mainly of piezoelectric ceramic materials are widely used in actuators and various sensors. For example, in piezoelectric actuators, input electrical energy is converted into mechanical energy by the inverse piezoelectric effect, and by using this principle, the operation of various types of electronic equipment can be controlled with high accuracy. Furthermore, in piezoelectric sensors, input mechanical energy is converted into electrical energy by the piezoelectric effect so that electrical signals can be detected, and by using this principle, various data, such as pressure values and acceleration, can be measured.

In recent years, there have been demands for realizing small-size, high-performance piezoelectric devices, and research and development has been carried out actively on piezoelectric devices including piezoelectric ceramic layers having a decreased thickness.

For example, Patent Document 1 proposes a piezoelectric device including, as shown in FIG. 12, a first electrode 101, a first piezoelectric layer 102 which is formed at an upper side and lateral sides of the first electrode 101, a porous layer 103 which is formed so as to cover side surfaces of the first piezoelectric layer 102, and a second electrode 104 which is formed at an upper side of the first piezoelectric layer 102 and the porous layer 103, the porous layer 103 containing at least one metal element constituting the first piezoelectric layer 102.

In Patent Document 1, an insulating layer 105 composed of an insulating material having a lower Young's modulus than the second electrode 104 is disposed between the porous layer 103 and the second electrode 104 such that side surfaces of the insulating layer 105 are inclined with respect to an upper surface of the porous layer 103.

Furthermore, in Patent Document 1, the first electrode 101, the first piezoelectric layer 102, the porous layer 103, the insulating layer 105, and the second electrode 104 are successively formed on a flat plate-shaped substrate 106 composed of a semiconductor or the like, by using a thin film forming method such as a sputtering method, a plating method, or the like, and further by using a photolithographic technique. Thereby, a piezoelectric device is fabricated.

In Patent Document 1, by configuring such that connecting portions between side surfaces of the first piezoelectric layer 102 and an upper surface of the substrate 106 are not covered by the second electrode 104, and that the insulating layer 105 having a lower Young's modulus than the second electrode 104 is disposed between the porous layer 103 and the second electrode 104, stress is suppressed from concentrating on the second electrode 104, and cracks are prevented from being generated in the second electrode 104 covering corner portions of the insulating layer 105.

Patent Document 1: Japanese Unexamined Patent Application Publication No. 2012-33866 (Claims 1, 3, and 4, paragraphs [0008], [0014] to [0017], [0072] to [0084], etc.)

SUMMARY OF THE INVENTION

Patent Document 1, in which the first electrode 101, the piezoelectric layer 102, the second electrode 104, and the like are successively formed on the substrate 106, is suitable for the application of MEMS (micro-electro-mechanical systems) in which various electronic components and the like are integrated on the substrate 106. However, Patent Document 1 is not suitable for the application of bending type piezoelectric components which do not require a substrate. In this case, a method may be conceivable in which after components of the piezoelectric device, such as the piezoelectric layer 102, are formed on the substrate 106, the substrate 106 is removed by grinding. However, the formed components, such as the piezoelectric layer 102, have poor mechanical strength, and the rigidity of the piezoelectric device is secured by the substrate 106. Therefore, in the grinding process, structural defects, such as cracks, interlayer separation, and device deformation, are likely to occur.

Accordingly, in order to obtain a piezoelectric device which does not require a substrate, it is considered to be preferable to form a main portion by using a sintered body instead of by a thin film forming method or plating method. In this case, as shown in FIG. 13, the main portion of a piezoelectric device is composed of a sintered body in which first and second conductor portions 108 and 109 are disposed on both principal surfaces of a thin piezoelectric ceramic base body 107. The mechanical strength of the piezoelectric ceramic base body 107 can be secured by the first and second conductor portions 108 and 109. Therefore, for example, in the case where the sintered body is fixed to a support plate 110 at one end, with the other end being a free end, even when an external force is applied in a direction indicated by arrow X, due to the malleability of the first and second conductor portions 108 and 109, local stress concentration does not occur in the piezoelectric ceramic base body 107, and only a relatively small amount of stress occurs in the vicinity of the fixed end. Accordingly, for example, during formation of an electrode layer on the first conductor portion 108, even when an external force is applied to the piezoelectric ceramic base body 107, it is considered that occurrence of structural defects, such as cracks and interlayer separation, can be suppressed.

On the other hand, in such a piezoelectric device including a piezoelectric ceramic base body 107 having a decreased thickness, as shown in FIG. 14, one of the first and second conductor portions 108 and 109, for example, the first conductor portion 108, may be used by being subjected to a patterning process in many cases. In this case, the first conductor portion 108 is divided into conductive films 108a and 108b having a predetermined pattern, which gives rise to the following problem.

That is, since the piezoelectric ceramic base body 107 is exposed to the surface in the gap between the conductive film 108a and the conductive film 108b, when an external force is applied in the direction indicated arrow X, as shown in FIG. 15, stress concentrates on a corner portion Z at which the conductive film 108a is in contact with the piezoelectric ceramic base body 107. As indicated by a two-dot chain line, there is a concern that a crack 110 may originate from the corner portion Z so as to penetrate the piezoelectric ceramic base body 107, and structural defects may occur in the piezoelectric ceramic base body 107. The situation is substantially the same for the conductive film 108b.

In the case where the first conductor portion 108 includes the conductive films 108a and 108b having a predetermined pattern as described above, since the piezoelectric ceramic base body 107 is partially exposed to the surface, local stress concentration is highly likely to occur in the piezoelectric ceramic base body 107. Furthermore, in the case where a piezoelectric ceramic base body has a multilayer structure including an internal conductor and both principal surfaces of the piezoelectric ceramic base body are composed of a ceramic material, the same problem as that described above occurs. Therefore, when an external force is applied to the piezoelectric ceramic base body 107 in an electrode layer formation step or the like, there is a concern that stress concentration may cause device deformation and structural defects, such as cracks and interlayer separation.

The present invention has been made under these circumstances, and it is an object of the present invention to provide a piezoelectric device which can suppress occurrence of structural defects, such as cracks and interlayer separation, even when an external force is applied, which does not cause degradation in operation performance, and which has good mechanical strength and good processability, and a method for manufacturing a piezoelectric device in which occurrence of deformation and structural defects can be suppressed even when an external force is applied during the manufacturing process.

The present inventor has performed thorough studies on a sintered body in which conductor portions are disposed on both principal surfaces of a piezoelectric ceramic base body, and the conductor portion on one of the principal surfaces includes a plurality of conductive films, and has conducted stress analysis. As a result, it has been found that by interposing an insulating film having a malleability equal to or greater than that of the conductive films in the gap between the conductive films, stress concentration in the piezoelectric ceramic base body can be relieved, and that thereby, even when an external force is applied to the piezoelectric ceramic base body, degradation in operation performance is not caused, and structural defects, such as cracks and interlayer separation, can be suppressed.

The present invention is based on these findings. A piezoelectric device according to the present invention includes a sintered body in which conductor portions are disposed on both principal surfaces of a piezoelectric ceramic base body, and at least one of the conductor portions on the principal surfaces includes a plurality of conductive films having a predetermined pattern. An insulating film is formed on the principal surface of the piezoelectric ceramic base body on which the conductive films are disposed such that at least portions of the conductive films are exposed. The insulating film has a malleability equal to or greater than that of the conductive films.

Thus, since the piezoelectric ceramic base body is protected by the conductive films and the insulating film, occurrence of local stress concentration in the piezoelectric ceramic base body can be relieved. Accordingly, even when an external force is applied to the piezoelectric ceramic base body, occurrence of structural defects, such as cracks and interlayer separation, can be suppressed, and degradation in operation performance is not caused. It is possible to obtain a piezoelectric device having good mechanical strength and good processability. Furthermore, since each conductor portion is made of a sintered body (sintered metal), the interface between the piezoelectric ceramic base body and the conductor portion has irregularities of at least 50 nm or more. Therefore, adhesion between the piezoelectric ceramic base body and the conductor portion can be further strengthened by the anchoring effect.

Furthermore, there is a correlation between the malleability and the Young's modulus of a material. A material having a high malleability has a low Young's modulus, and a material having a low malleability has a high Young's modulus. Therefore, the malleability of a material can be evaluated from the Young's modulus.

That is, in the piezoelectric device of the present invention, preferably, the insulating film has a Young's modulus equal to or less than that of the conductive films.

Furthermore, when stress is applied to a material, the amount of deflection is inversely proportional to the Young's modulus of the material, and inversely proportional to the cube of the thickness. Therefore, in the case where the insulating film is formed thicker than the conductive films, resulting in an increase in rigidity, by using an insulating film having a low Young's modulus, it is possible to avoid degradation in operation performance of a piezoelectric device.

That is, in the piezoelectric device of the present invention, preferably, a relationship represented by the expression (1) below is established among the average thickness ts of the insulating film, the average thickness tm of the conductive films, the Young's modulus Es of the insulating film, and the Young's modulus Em of the conductive films.

$$(ts/tm)^3 < Em/Es \tag{1}$$

Furthermore, in the piezoelectric device of the present invention, the piezoelectric ceramic base body preferably has an average thickness of 90 μm or less and preferably has an average thickness of 4 μm or more.

Thus, it is possible to obtain a foil-shaped sintered body including a very thin piezoelectric ceramic base body with an average thickness of 90 μm or less and 4 μm or more. A thin, small-sized piezoelectric device having good processability can be obtained even without forming a thin film on a substrate by a thin film forming method, plating method, or the like.

Furthermore, in the piezoelectric device of the present invention, preferably, the piezoelectric ceramic base body has a multilayer structure including an internal conductor.

Thus, even in the case where the piezoelectric ceramic base body has a multilayer structure, occurrence of local stress concentration in the piezoelectric ceramic base body can be relieved, and a desired piezoelectric device having good mechanical strength can be obtained.

Furthermore, as a material constituting the insulating film having a malleability equal to or greater than that of the conductive films, for example, an organic compound may be used.

That is, in the piezoelectric device of the present invention, preferably, the insulating film contains an organic compound as a main component.

Furthermore, in the piezoelectric device of the present invention, preferably, the piezoelectric ceramic base body contains a perovskite-type compound containing at least niobium and an alkali metal element, and preferably, the conductor portions contain a non-precious metal material.

Thus, an inexpensive piezoelectric device with a reduced environmental load can be easily obtained.

Furthermore, in the piezoelectric device of the present invention, preferably, a plurality of electrode layers are disposed on each of the conductive films.

Thus, even in the case where the pattern of the conductive films is complex, multilayer interconnections can be formed without being aware of the positional relationship among the conductive films and the electrode layers. Furthermore, since the piezoelectric ceramic base body is protected by the insulating film, it is possible to obtain a piezoelectric device having high toughness, good mechanical strength, and a high degree of design freedom.

Furthermore, a method for manufacturing a piezoelectric device according to the present invention includes a firing step in which a conductive material is applied, in the shape of a sheet, to both principal surfaces of a piezoelectric ceramic sheet, or a multilayer body including a piezoelectric ceramic sheet and a conductive material formed into sheets is produced, and the piezoelectric ceramic sheet and the conductive material are cofired to form conductor portions on both principal surfaces of a piezoelectric ceramic base body; a patterning step in which by subjecting one of the conductor portions to a patterning process, a plurality of conductive films are formed, thereby to obtain a sintered body; and an insulating film formation step in which an insulating material having a malleability equal to or greater than that of the conductive material is prepared, and by applying the insulating material onto the piezoelectric ceramic base body such that at least portions of the conductive films are exposed, an insulating film is formed.

Thus, even when an external force is applied in the manufacturing process, occurrence of deformation and structural defects can be suppressed, and it is possible to obtain a high-performance, foil-shaped piezoelectric device having desired operation performance.

Furthermore, in the method for manufacturing a piezoelectric device according to the present invention, preferably, the insulating material has a Young's modulus equal to or less than that of the conductive material.

Furthermore, in the method for manufacturing a piezoelectric device according to the present invention, preferably, the insulating material is composed of an organic compound.

Furthermore, preferably, the method for manufacturing a piezoelectric device according to the present invention further includes an electrode layer formation step of forming a plurality of electrode layers on each of the conductive films.

Thus, in the manufacturing process, interlayer separation does not occur between the piezoelectric ceramic base body and the insulating film or the conductive films, cracks and the like do not occur in the piezoelectric ceramic base body, and multilayer interconnections can be formed without being aware of the positional relationship among the conductive films and the electrode layers.

Thus, since the piezoelectric ceramic base body is protected by the conductive films and the insulating film, even when an external force is applied, occurrence of local stress concentration in the piezoelectric ceramic base body can be relieved, occurrence of structural defects, such as cracks and interlayer separation, can be suppressed, and degradation in operation performance is not caused. It is possible to obtain a piezoelectric device having good mechanical strength and good processability.

In the method for manufacturing a piezoelectric device according to the present invention, even when an external force is applied in the manufacturing process, occurrence of deformation and structural defects can be suppressed, and it is possible to easily obtain a high-performance piezoelectric device having desired operation performance.

DETAILED DESCRIPTION OF THE PREFERRED EMBODIMENTS

Embodiments of the present invention will be described in detail below.

Figure 1:
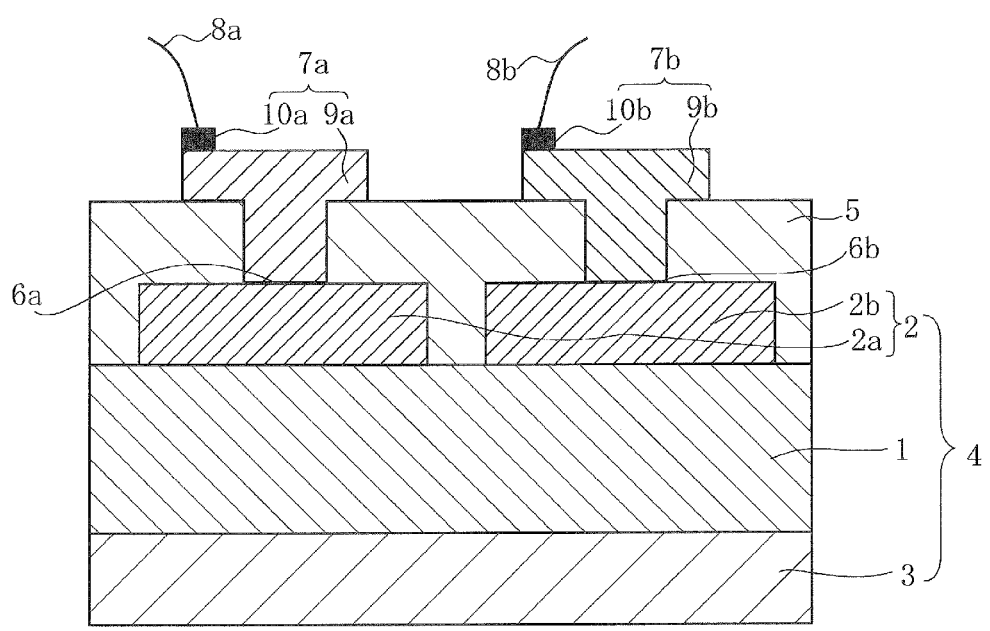
FIG. 1 is a cross-sectional view schematically showing an embodiment (first embodiment) of a piezoelectric device according to the present invention.

FIG. 1 is a cross-sectional view schematically showing an embodiment (first embodiment) of a piezoelectric device according to the present invention.

The piezoelectric device includes a sintered body 4 in which a first conductor portion 2 and a second conductor portion 3 are disposed on both principal surfaces of a piezoelectric ceramic base body 1, and the first conductor portion 2 includes a plurality of conductive films (conductive films 2a and 2b in FIG. 1) having a predetermined pattern. The conductive films 2a and 2b and the second conductor portion 3 are made of a sintered metal. Specifically, the piezoelectric ceramic base body 1 is made of a bulk ceramic, which has, for example, a length of about 3.0 cm and a width of about 4.0 cm, and is very thin, for example, with a thickness of about 15 μm.

Furthermore, an insulating film 5 is formed on the principal surface of the piezoelectric ceramic base body 1 on which the conductive films 2a and 2b are disposed such that portions of the conductive films 2a and 2b are exposed through the insulating film 5. That is, the insulating film 5 is thicker than the conductive films 2a and 2b, and the entire region of the piezoelectric ceramic base body 1 and portions of the conductive films 2a and 2b are covered by the insulating film 5 such that exposed surfaces 6a and 6b of the conductive films 2a and 2b are formed.

Electrode layers 7a and 7b are disposed on the exposed surfaces 6a and 6b of the conductive films 2a and 2b, and conductor wires 8a and 8b composed of Cu or the like are connected by wire bonding to the electrode layers 7a and 7b.

Specifically, the electrode layers 7a and 7b include extended electrode layers 9a and 9b in contact with the exposed surfaces 6a and 6b of the conductive films 2a and 2b, and line electrode layers 10a and 10b formed on the extended electrode layers 9a and 9b. That is, in the piezoelectric device, multilayer interconnections are formed by the conductive films 2a and 2b, the extended electrode layers 9a and 9b, and the line electrode layers 10a and 10b so that the conductive films 2a and 2b can be electrically connected to the conductor wires 8a and 8b.

The insulating film 5 is formed of an insulating material having a malleability equal to or greater than that of the conductive films 2a and 2b. The reason for forming the insulating film 5 by using an insulating material having a malleability equal to or greater than that of the conductive films 2a and 2b is as follows.

In the first embodiment, the piezoelectric ceramic base body 1 is formed very thin, for example, with a thickness of about 15 μm as described above, and the conductive films 2a and 2b each have a thickness of about 2 μm. The sintered body 4 is foil-shaped with a total thickness of about 19 μm.

Accordingly, in the case where the first conductor portion 2 includes conductive films 2a and 2b which are separated from each other and have a predetermined pattern, regions in which the piezoelectric ceramic base body 1 is exposed have particularly poor toughness. Therefore when an external force is applied to the piezoelectric ceramic base body 1 in the electrode layer formation step and the like, deformation of the piezoelectric ceramic base body 1 may be caused; or stress concentrates on contact portions between the piezoelectric ceramic base body 1 and corner portions of the conductive films 2a and 2b, and there is a concern that cracks may originate from the contact portions and propagate toward the inside of the piezoelectric ceramic base body 1 and interlayer separation may occur.

In this embodiment, the insulating film 5 is formed on the piezoelectric ceramic base body 1 and the conductive films 2a and 2b such that portions of the conductive films 2a and 2b are exposed, and the piezoelectric ceramic base body 1 is protected by the insulating film 5. Thereby, stress concentration on surface-exposed portions of the ceramic base body 1, in particular, contact portions with the conductive films 2a and 2b, is relieved.

However, when the insulating film 5 is formed of an insulating material having a lower malleability than the conductive films 2a and 2b, the rigidity of the piezoelectric device increases. Therefore, there is a concern that degradation in operation performance, such as a decrease in displacement when used as a piezoelectric actuator and a decrease in sensing capability when used as a piezoelectric sensor, may be caused, and the piezoelectric device may not perform a desired function. On the other hand, when a thin film is formed by using an insulating material having a low malleability, the overall rigidity of the piezoelectric device decreases. Therefore, there is a concern that stress concentration may cause cracks in the insulating film 5 itself, and the cracks may propagate into the piezoelectric ceramic base body 1.

Accordingly, in this embodiment, the insulating film 5 having a malleability equal to or greater than that of the conductive films 2a and 2b covers the piezoelectric ceramic base body 1 such that portions of the conductive films 2a and 2b are exposed. Thus, degradation in operation performance is not caused, and even when an external force is applied, occurrence of local stress concentration in the piezoelectric ceramic base body 1 can be suppressed, and occurrence of structural defects, such as cracks and interlayer separation, can be avoided. It is possible to obtain a piezoelectric device having good processability.

Furthermore, the malleability of the insulating film 5 can be evaluated from the Young's modulus. That is, there is a correlation between stress σ caused by strain (extensional deformation) and strain ε, and malleability can be evaluated from the ratio of stress σ to strain ε, i.e., the Young's modulus ($=\sigma/\varepsilon$). Specifically, as malleability (strain ε) increases, the Young's modulus decreases, and as malleability (strain ε) decreases, the Young's modulus increases.

Accordingly, when an insulating film 5 composed of an insulating material having a low Young's modulus is formed on the piezoelectric ceramic base body 1, since the malleability of the insulating film 5 increases, the rigidity, i.e., reaction force, of the piezoelectric device decreases. The piezoelectric ceramic base body 1 is protected by the insulating film 5, and even when an external force is applied, the stress is absorbed by the insulating film 5, and occurrence of local stress concentration can be suppressed. Thereby, occurrence of structural defects, such as cracks and interlayer separation, in the piezoelectric ceramic base body 1 can be suppressed, and good mechanical strength can be obtained.

On the other hand, when an insulating film 5 having a high Young's modulus is used, the reaction force (rigidity of the piezoelectric device) increases. That is, when the Young's modulus of the insulating film 5 is equal to the Young's modulus of the conductive films 2a and 2b, the reaction force (rigidity of the piezoelectric device) becomes equal to that in the case where the first conduction portion 2 is formed over the entire principal surface of the piezoelectric ceramic base body 1. When the insulating film 5 has a higher Young's modulus than the conductive films 2a and 2b, stress occurring in the piezoelectric ceramic base body 1 and the insulating film 5 rather increases, and the reaction force, i.e., the rigidity of the piezoelectric device, increases excessively. Therefore, there is a concern that degradation of operation performance, such as decreases in displacement and sensing capability, may be caused.

In other words, when the Young's modulus of the insulating film 5 is equal to or less than the Young's modulus of the conductive films 2a and 2b, due to the malleability of the insulating film 5, even when an external force is applied to the piezoelectric ceramic base body 1, occurrence of local stress concentration is relieved, degradation in operation performance is not caused, and occurrence of structural defects in the piezoelectric ceramic base body 1 can be suppressed.

Therefore, it is necessary to set the Young's modulus of the insulating film 5 to be equal to or less than that of the conductive films 2a and 2b.

The insulating material constituting such an insulating film 5 is not particularly limited as long as it has a Young's modulus equal to or less than that of the conductive films 2a and 2b and a high malleability. Usually, an insulating material containing an organic compound, such as an epoxy resin, polyimide resin, or acrylic resin, as a main component (for example, 50% by volume or more) can be used. The Young's modulus (malleability) can be adjusted by incorporating an appropriate additive into the organic compound.

As described above, this embodiment includes the sintered body 4 in which first and second conductor portions 2 and 3 are disposed on both principal surfaces of the piezoelectric ceramic base body 1, and the first conductor portion 2 includes conductive films 2a and 2b having a predetermined pattern. The insulating film 5 is formed on the principal surface of the piezoelectric ceramic base body 1 on which the conductive films 2a and 2b are disposed such that at least portions of the conductive films 2a and 2b are exposed. The insulating film 5 has a malleability equal to or greater than that of the conductive films. Therefore, even when an external force is applied, occurrence of structural defects, such as cracks and interlayer separation, can be suppressed, and degradation in operation performance is not caused. It is possible to obtain a piezoelectric device having good mechanical strength and good processability.

Furthermore, the electrode layers 7a and 7b including the extended electrode layers 9a and 9b and the line electrode layers 10a and 10b are disposed on the conductive films 2a and 2b. Therefore, even in the case where the pattern of the conductive films is complex, multilayer interconnections can be formed without being aware of the positional relationship among the conductive films 2a and 2b, the extended electrode layers 9a and 9b, and the line electrode layers 10a and 10b. Furthermore, since the piezoelectric ceramic base body 1 is protected by the insulating film 5, it is possible to obtain a piezoelectric device having high toughness, good mechanical strength, and a high degree of design freedom.

In this embodiment, the thickness of the piezoelectric ceramic base body 1 is illustratively set at 15 μm, as described above, but is not particularly limited as long as the piezoelectric ceramic base body 1 is formed very thin. From the viewpoint of achieving desired sinterability and obtaining a small-size, low profile piezoelectric device, the average thickness is preferably 90 μm or less, and more preferably 4 μm or more.

Furthermore, the piezoelectric ceramic material constituting the piezoelectric ceramic base body 1 is not particularly limited. For example, various composite oxides containing, as a main component (for example, 90 mole percent or more), a perovskite-type compound represented by the general formula $ABO_3$ can be used. Examples thereof include alkali niobate-based composite oxides containing Nb and an alkali meal, such as Li, K, or Na; lead titanate (PT)-based composite oxides containing Pb, Ti, and the like; and lead zirconate titanate (PZT)-based composite oxides containing Pb, Ti, Zr, and the like. It is also preferable to incorporate various additives, such as a rare-earth element (e.g., Ca, Mn, Ta, Yb, or the like), as necessary.

However, in consideration of reduction in environmental load and the like, it is preferable to use a non-Pb material which does not contain Pb, such as a piezoelectric ceramic material containing, as a main component, an alkali niobate-based perovskite-type compound.

Furthermore, as the conductive material constituting the first and second conductor portions 2 and 3, a material that can be cofired with the piezoelectric ceramic material can be used. For example, in the case where the piezoelectric ceramic base body 1 is formed of an alkali niobate-based composite oxide, in consideration of costs, it is preferable to use a conductive material containing, as a main component, a non-precious metal material, such as Ni, Cu, or an alloy thereof, that can be cofired with the alkali niobate-based composite oxide in a reducing atmosphere. Furthermore, in the case where the piezoelectric ceramic base body 1 is formed of a Pb-based composite oxide, such as a PT-based or PZT-based composite oxide, it is preferable to use Cu. In the case where it is difficult to cofire with a non-precious metal material, a conductive material containing, as a main component, a precious metal material, such as Ag, Pd, or Ag—Pd, can be used.

Furthermore, the electrode material constituting the electrode layers 7a and 7b (extended electrode layers 9a and 9b and line electrode layers 10a and 10b) is not particularly limited as long as it has good conductivity, good mechanical strength, and good heat resistance. For example, Cu, Ti, Ni, Au, Sn, and Al can be used.

Furthermore, in the present invention, preferably, a relationship represented by the expression (1) below is established among the average thickness ts of the insulating film 5, the average thickness tm of the conductive films 2a and 2b, the Young's modulus Es of the insulating film 5, and the Young's modulus Em of the conductive films 2a and 2b.

$$(ts/tm)^3 < Em/Es \quad (1)$$

Thus, even in the case where the average thickness ts of the insulating film 5 is larger than the average thickness tm of the conductive films 2a and 2b, as shown in FIG. 1, degradation in operation performance can be avoided.

Figure 2:
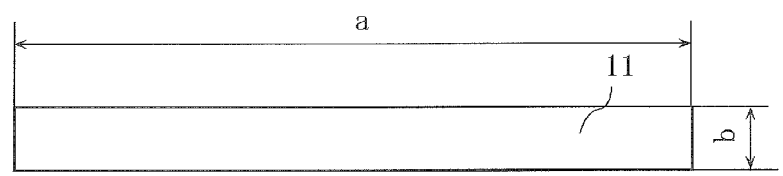
FIG. 2 includes views for illustrating the relationship between the load and deflection.
Figure 2:
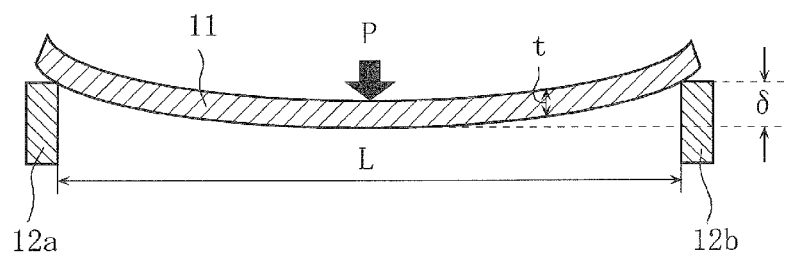

That is, as shown in FIG. 2 (parts (a) and (b)), in the case where both ends of a rectangular object 11 with a length a in the long direction, a width b in the short direction, and a thickness t are supported by supports 12a and 12b (distance L between the supports), and stress σ is generated by applying a load P to the center, the deflection δ can be represented by the expression (2), where E is the Young's modulus.

$$\delta = \frac{1}{4}\frac{L^3}{bt^3}\frac{1}{E}P \quad (2)$$

As is evident from the expression (2), when stress σ is generated by applying the load P to the rectangular object 11, the deflection δ is inversely proportional to the Young's modulus E of the rectangular object 11, and inversely proportional to the cube of the thickness t.

Accordingly, when the average thickness ts of the insulating film 5 is set to be larger than the average thickness tm of the conductive film 2a as shown in FIG. 1, rigidity increases. However, by using an insulating material having a low Young's modulus for the insulating film 5, degradation in operation performance can be avoided.

Specifically, as shown in the expression (1), preferably, the cube of the ratio of the average thickness of the insulating film 5 to that of the conductive films 2a and 2b (ts/tm), i.e., $(ts/tm)^3$ to be less than the reciprocal of the ratio of the Young's modulus of the insulating film 5 to that of the conductive films 2a and 2b (Es/Em), and it is preferably to select an insulating material having such a Young's modulus.

A method for manufacturing the piezoelectric device will be described in detail below with reference to FIGS. 3 to 8.

Note that, in FIGS. 5 to 8, part (a) is a plan view of an intermediate product obtained in a corresponding manufacturing step, and part (b) is a cross-sectional view taken along the line indicated by arrows A-A, B-B, C-C, or D-D in the plan view.

First, ceramic raw materials are prepared. For example, in the case where a piezoelectric ceramic base body 1 is formed by using an alkali niobate-based compound, a K compound, a Na compound, a Li compound, a Nb compound, and the like are prepared. In the case where a piezoelectric ceramic base body 1 is formed by using a PZT-based compound, a Pb compound, a Ti compound, a Zr compound, and the like are prepared. As necessary, various additives are prepared.

Next, the ceramic raw materials are weighed such that a predetermined mixing molar ratio is obtained. The weighed materials are fed into a pot mill containing a grinding medium, such as PSZ balls, and then, in the presence of a solvent, wet-mixing and pulverization are performed thoroughly while rotating the pot mill for a predetermined time. After drying is performed, a calcination treatment is performed. Thereby, a ceramic raw material powder is obtained.

Next, after being disintegrated, the ceramic raw material powder is fed into a pot mill again together with an organic binder, an organic solvent, a dispersant, a plasticizer, and a grinding medium. Wet-mixing and pulverization are performed thoroughly while rotating the pot mill, thereby to obtain a ceramic slurry.

Figure 3:
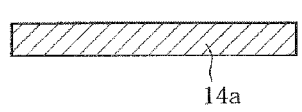
FIG. 3 is a flow diagram (1/6) showing a manufacturing procedure in a manufacturing method of the first embodiment.
Figure 3:
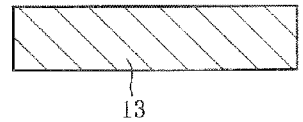
Figure 3:
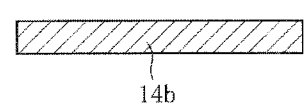

Subsequently, the ceramic slurry is subjected to a forming process by using a doctor blade method, and a piezoelectric ceramic sheet 13 is formed such that the thickness after firing is preferably 90 μm or less (FIG. 3, part (b)).

Similarly, a conductive material, such as Ni or Cu, is prepared. The conductive material, together with an organic binder, an organic solvent, a dispersant, and a plasticizer, is fed into a pot mill containing a grinding medium, and wet-mixing is performed thoroughly while rotating the pot mill, thereby to produce a conductive slurry. Subsequently, the conductive slurry is subjected to a forming process by using a doctor blade method, and first and second conductive sheets 14b and 14a are formed such that the thickness after firing is preferably 1 to 40 μm (FIG. 3, part (a) and (c)).

Figure 4:
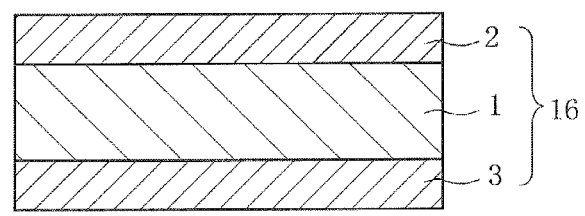
FIG. 4 is a flow diagram (2/6) showing a manufacturing procedure in the manufacturing method of the first embodiment.
Figure 5:
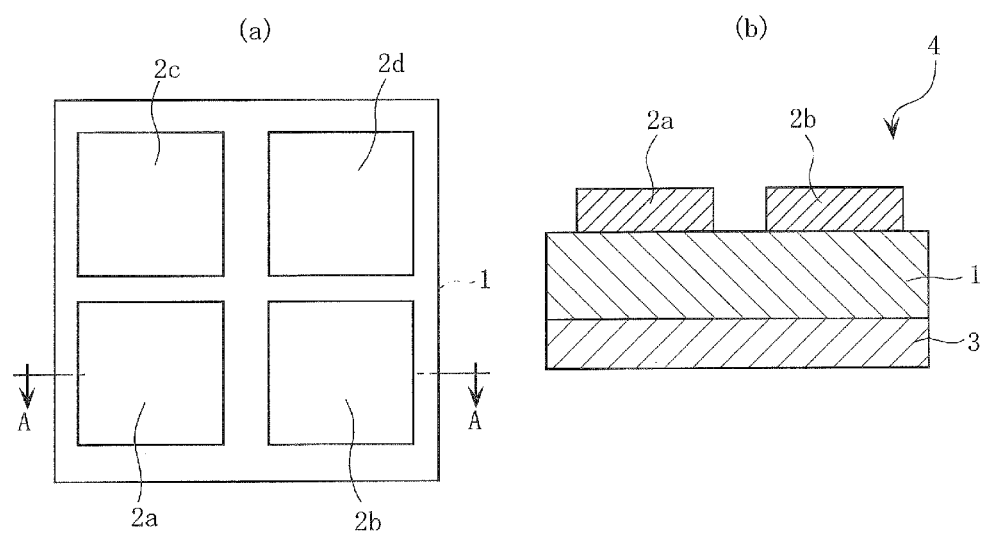
FIG. 5 is a flow diagram (3/6) showing a manufacturing procedure in the manufacturing method of the first embodiment.

Next, the piezoelectric ceramic sheet 13 is sandwiched between the first and second conductive sheets 14a and 14b, and then, firing is performed, thereby to form a co-sintered body 16 in which conductor portions (a first conductor portion 2 and a second conductor portion 3) are disposed on both principal surfaces of a piezoelectric ceramic base body 1 (FIG. 4). The conductor portions are made of a sintered metal.

Next, by using a photolithographic technique, the first conductor portion 2 is subjected to a patterning process to form conductive films 2a to 2d having a predetermined pattern. Thereby, a sintered body 4 is obtained (FIG. 5, parts (a) and (b)).

That is, after a photoresist is applied to a surface of the first conductor portion 2, prebaking is performed. Then, a mask having a predetermined pattern is placed above the photoresist, and exposure is performed by ultraviolet light irradiation so that the mask pattern is transferred to the photoresist. Next, after development is performed, washing is performed with pure water. Then, wet etching is performed by immersing the workpiece in an etching solution, such as a ferric chloride solution. Subsequently, the developed photoresist is removed by using a stripping solution. Thereby, conductive films 2a to 2d having a predetermined pattern, which are separated from one another, are formed.

Figure 6:
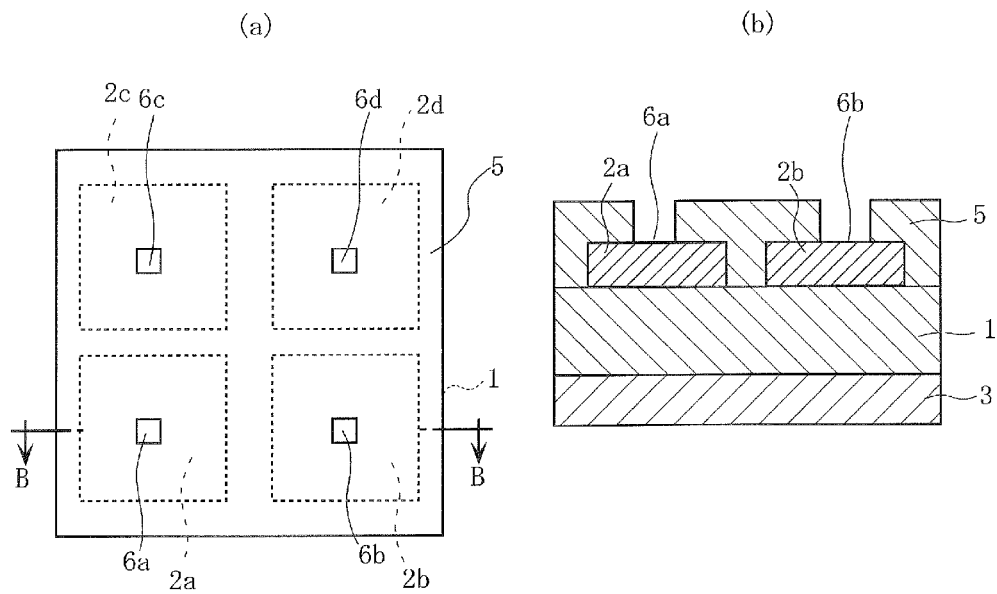
FIG. 6 is a flow diagram (4/6) showing a manufacturing procedure in the manufacturing method of the first embodiment.

Next, an insulating film 5 is formed on the piezoelectric ceramic base body 1 and the conductive films 2a to 2d such that portions of the conductive films 2a to 2d are exposed (FIG. 6, parts (a) and (b)).

That is, for example, an insulating solution containing a photosensitive insulating material, such as a photosensitive epoxy resin, is prepared. Subsequently, by using a coating method, such as spin coating, the insulating solution is applied onto the piezoelectric ceramic base body 1 and the conductive films 2a to 2d, followed by prebaking. Exposure is performed with a mask having a predetermined pattern interposed, followed by development. Subsequently, by performing post baking, an insulating film 5 from which portions of the conductive films 2a to 2d, i.e., exposed surfaces 6a to 6d, are exposed is formed.

Figure 7:
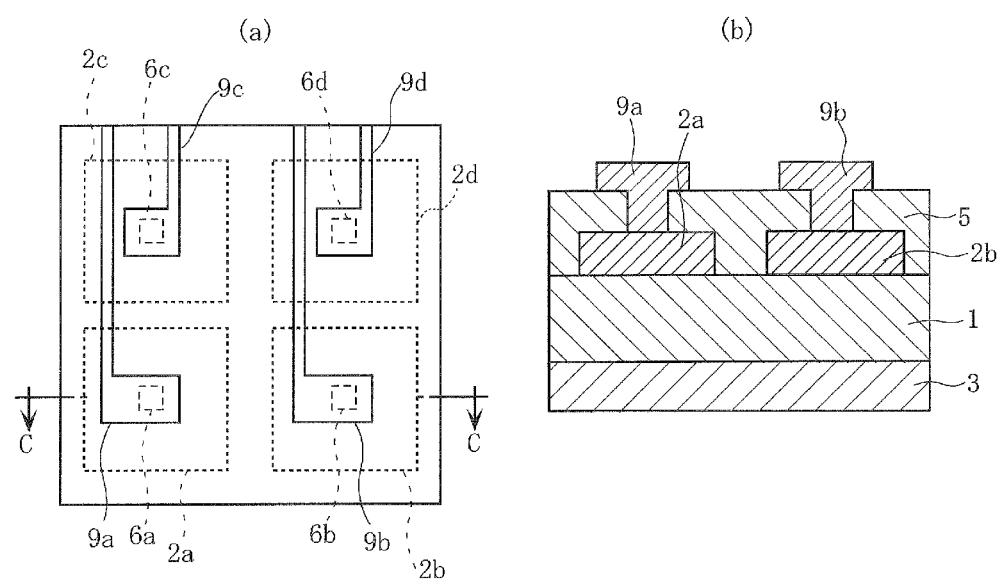
FIG. 7 is a flow diagram (5/6) showing a manufacturing procedure in the manufacturing method of the first embodiment.
Figure 8:
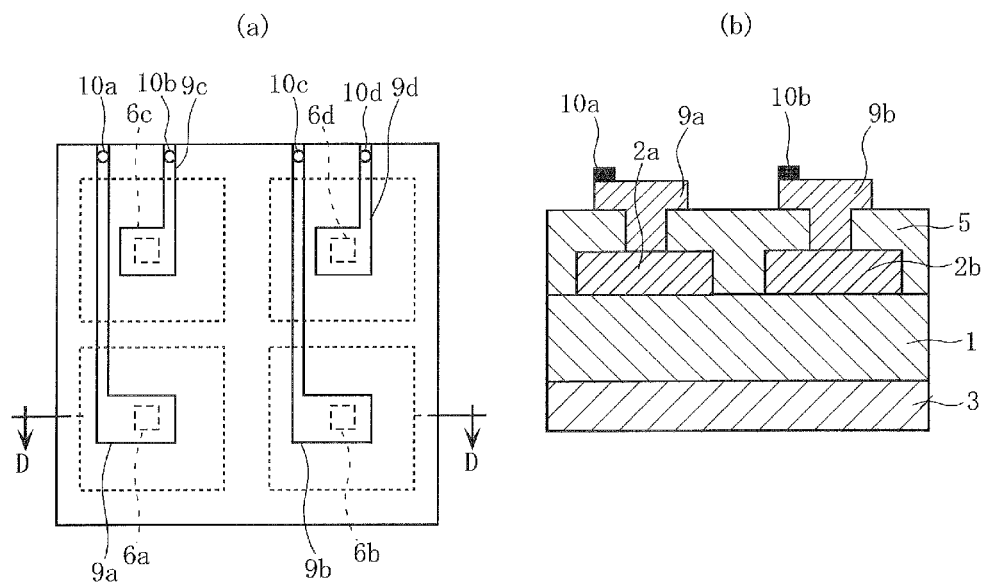
FIG. 8 is a flow diagram (6/6) showing a manufacturing procedure in the manufacturing method of the first embodiment.

Next, extended electrode layers 9a to 9d are formed on the conductive films 2a and 2b (FIG. 7, parts (a) and (b)).

That is, first, a conductive layer is formed on the surface of the sintered body 4 on which the insulating film 5 is disposed by using a thin film forming method, such as a sputtering method, and then, by using the photolithographic technique, extended electrode layers 9a to 9d having a predetermined pattern are formed.

Next, line electrode layers 10a to 10d are formed at predetermined positions on the upper surfaces of the extended electrode layers 9a to 9d. That is, after a conductive layer is formed on the surface of the sintered body 4 on which the extended electrode layers 9a to 9d are disposed by a plating method or the like, by using the photolithographic technique, line electrode layers 10a to 10d are formed in a land shape at predetermined positions on the upper surfaces of the extended electrode layers 9a to 9d (FIG. 8, parts (a) and (b)).

Subsequently, conductor wires composed of Cu or the like are connected by wire bonding to the line electrode layers 10a to 10d. Thereby, a piezoelectric device is fabricated.

As described above, this manufacturing method includes a firing step in which conductive sheets 14a and 14b are disposed on both principal surfaces of a piezoelectric ceramic sheet 13, and the piezoelectric ceramic sheet 13 and the conductive sheets 14a and 14b are cofired to form first and second conductor portions 2 and 3 on both principal surfaces of a piezoelectric ceramic base body 1; a patterning step in which by subjecting the first conductor portion 2 to a patterning process, conductive films 2a to 2d are formed, thereby to obtain a sintered body 4; and an insulating film formation step in which an insulating material having a malleability equal to or greater than that of the conductive material is prepared, and by applying the insulating material onto the piezoelectric ceramic base body 1 such that portions of the conductive films 2a and 2b are exposed, an insulating film 5 is formed. Therefore, even when an external force is applied in the manufacturing process, occurrence of deformation and structural defects can be suppressed, and it is possible to obtain a high-performance, thin piezoelectric device having desired operation performance.

Furthermore, extended electrode layers 9a to 9d and line electrode layers 10a to 10d are formed on the conductive films 2a and 2b. Therefore, in the manufacturing process, interlayer separation does not occur between the piezoelectric ceramic base body 1 and the insulating film 5 or the conductive films 2a to 2d, cracks and the like do not occur in the piezoelectric ceramic base body 1, and multilayer interconnections can be formed without being aware of the positional relationship among the extended electrode layers 9a to 9d, the line electrode layers 10a to 10d and the conductive films 2a and 2b.

Figure 9:
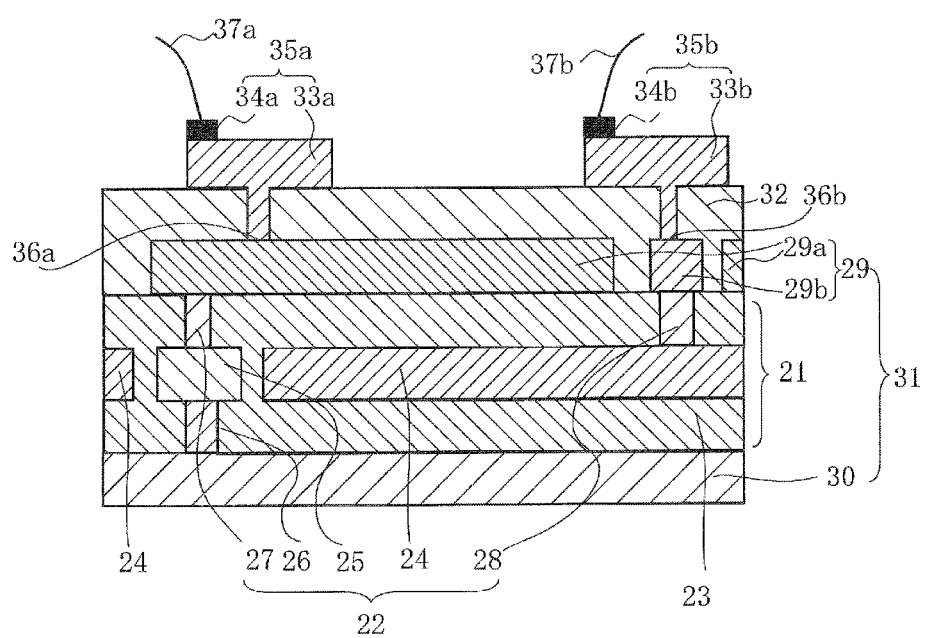
FIG. 9 is a cross-sectional view schematically showing a second embodiment of a piezoelectric device according to the present invention.

FIG. 9 is a cross-sectional view schematically showing a second embodiment of a piezoelectric device according to the present invention.

In the second embodiment, a piezoelectric ceramic base body 21 has a multilayer structure including internal conductors 22, and the piezoelectric ceramic 21 is formed very thin with a thickness of preferably 90 μm or less, more preferably 4 μm or more, as in the first embodiment.

Specifically, the internal conductors 22 include planar conductors 24 and 25 embedded in a very thin ceramic sheet 23, and via conductors 26 to 28 connected to the planar conductors 24 and 25.

The piezoelectric device according to the second embodiment also includes, as in the first embodiment, a sintered body 31 in which a first conductor portion 29 and a second conductor portion 30 are disposed on both principal surfaces of the piezoelectric ceramic base body 21, and the first conductor portion 29 includes conductive films 29a and 29b having a predetermined pattern. Furthermore, an insulating film 32 is formed on the principal surface of the piezoelectric ceramic base body 21 on which the conductive films 29a and 29b are disposed such that portions of the conductive films 29a and 29b are exposed.

Furthermore, electrode layers 35a and 35b including extended electrodes 33a and 33b and line electrodes 34a and 34b are disposed on exposed surfaces 36a and 36b of the conductive films 29a and 29b. Conductor wires 37a and 37b composed of Cu or the like are connected by wire bonding to the line electrode layers 34a and 34b.

In the second embodiment, the conductive film 29a is electrically connected to the planar conductor 25 through the via conductor 27, and the planar conductor 25 is electrically connected to the first conductor portion 30 through the via conductor 26. Furthermore, the conductive film 29b is electrically connected to the planar conductor 24 through the via conductor 28.

Even in the case where the piezoelectric ceramic base body 21 has the multilayer structure including the internal conductors 22 as in the second embodiment, the very thin piezoelectric ceramic base body 21 with a thickness of 90 μm or less is covered by the conductive films 29a and 29b and the insulating film 32 as in the first embodiment. Accordingly, even when an external force is applied, occurrence of local stress concentration in the piezoelectric ceramic base body 21 can be relieved, occurrence of structural defects, such as cracks and interlayer separation, can be suppressed, and degradation in operation performance is not caused. It is possible to obtain a piezoelectric device having good mechanical strength and good processability.

Figure 10:
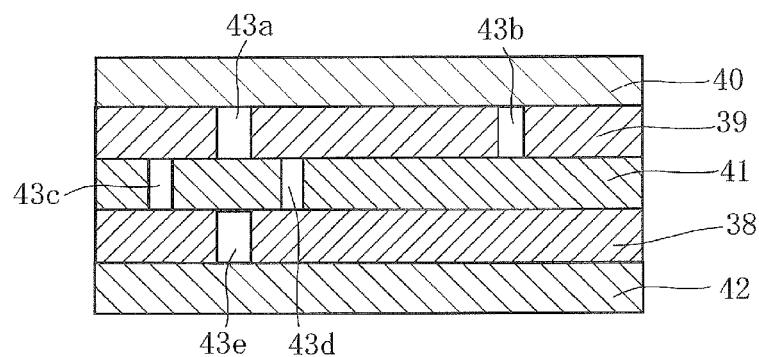
FIG. 10 includes cross-sectional views showing main portions in the manufacturing method of the second embodiment.
Figure 10:
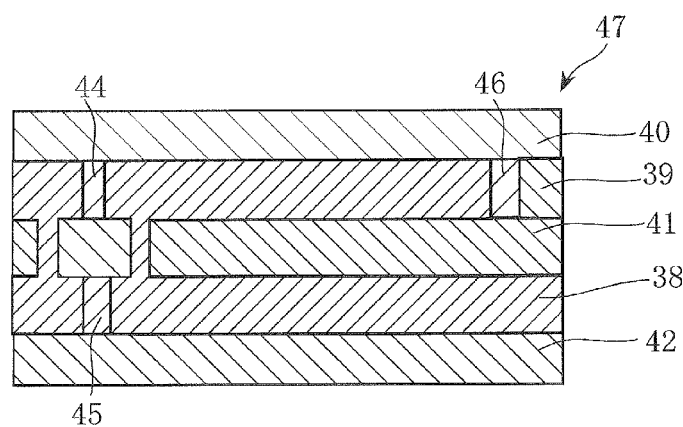
Figure 10:
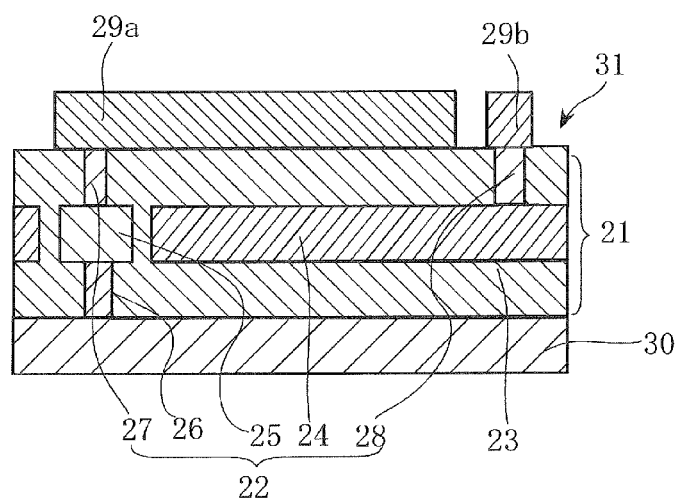

The piezoelectric ceramic base body 21 according to the second embodiment can be produced by the method shown in FIG. 10.

First, by the same method and procedure as those of the first embodiment, piezoelectric ceramic sheets 38 and 39 and conductive sheets 40, 41, and 42 are formed. Subsequently, by punching the piezoelectric ceramic sheets 38 and 39 and the conductive sheet 41 into a predetermined shape, through-holes 43a to 43e are formed. Then, the piezoelectric ceramic sheets 38 and 39 and the conductive sheets 40 to 42 are alternately stacked. Specifically, the conductive sheet 42, the piezoelectric ceramic sheet 38, the conductive sheet 41, the piezoelectric ceramic sheet 39, and the conductive sheet 40 are stacked in that order (FIG. 10, part (a)). During the stacking, by filling the through-holes 43a, 43b, and 43e in the piezoelectric ceramic sheets 38 and 39 with a conductive material, such as Cu, via conduction holes 44 to 46 are formed. Here, the through-holes are arranged such that the planar conductors 24 and 25 are electrically insulated from each other.

Next, pressure bonding is performed by pressing the principal surfaces of the conductive sheets 40 and 42 at a predetermined pressure. As a result, the conductive sheets 40 to 42 are electrically connected through the via conduction holes 44 to 46, and thereby, a multilayer body 47 is formed (FIG. 10, parts (b)).

However, in the case where the thickness of the conductive sheets 40 to 42 is sufficiently larger than the thickness of the piezoelectric ceramic sheets 38 and 39, for example, in the case where the thickness of the piezoelectric ceramic sheets 38 and 39 is 5 μm and the thickness of the conductive sheets 40 to 42 is 10 μm, even if the through-holes 43a, 43b, and 43e of the piezoelectric ceramic sheets 38 and 39 are not filled with a conductive material, the material of the conductive sheets will be extruded into the through-holes 43a, 43b, and 43e of the piezoelectric ceramic sheets 40 and 42 to achieve conduction. Similarly, in the case where the thickness of the piezoelectric ceramic sheets 38 and 39 is sufficiently larger than the thickness of the conductive sheets 40 to 42, the through-holes 43c and 43d of the conductive sheet 41 may be filled with a ceramic in some cases. Note that whether the through-holes 43c and 43d of the conductive sheet 41 are filled with a ceramic or not, basic characteristics of the piezoelectric device are not affected.

Subsequently, by the same method and procedure as those of the first embodiment, a piezoelectric device can be fabricated.

That is, the multilayer body 47 is cofired, and then, the first conductor portion 29 is subjected to a patterning process to form conductive films 29a and 29b. Thereby, a sintered body 31 is obtained (FIG. 10, part (c)).

That is, an insulating material having a malleability equal to or greater than that of the conductive material is prepared, and by applying the insulating material onto the piezoelectric ceramic base body 21 such that portions of the conductive films 29a and 29b are exposed, an insulating film 32 is formed. Then, extended electrode layers 33a and 33b and line electrode layers 34a and 34b are formed in that order. Thus, even when an external force is applied in the manufacturing process, occurrence of deformation and structural defects can be suppressed, and it is possible to obtain a high-performance, thin piezoelectric device having desired operation performance.

The present invention is not limited to the embodiments described above. For example, according to the embodiment described above, in the process of forming the co-sintered body 16, the piezoelectric ceramic sheet and the conductive sheets are each formed, the piezoelectric ceramic sheet is sandwiched between the conductive sheets, followed by pressure forming, and then, firing is performed. However, after a conductive paste is applied to both principal surfaces of a piezoelectric ceramic sheet, firing may be performed. Alternatively, a solution containing a conductive material may be applied by spin coating to both surfaces of a piezoelectric ceramic sheet, followed by thermal curing, and then firing may be performed.

Furthermore, according to the embodiment, an insulating film is formed such that portions of a plurality of conductive films are exposed. However, at least portions of the conductive films may be exposed and the entire surfaces of the conductive films may be exposed.

Furthermore, according to the embodiment described above, the first conductor portion is subjected to a patterning process. However, in addition to the first conductor portion, the second conductor portion may be subjected to a patterning process.

Examples of the present invention will be specifically described below.

Example 1

Analytical models (Model 0, Model 1, and Model 2) of a piezoelectric device were produced. Stress analysis was performed by using a finite element method, and simulations were carried out.

Figure 11:
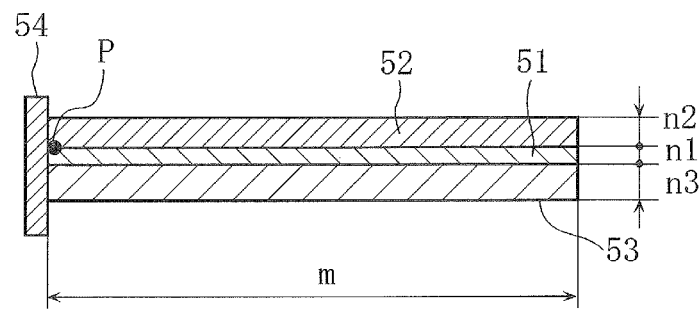
FIG. 11 includes schematic cross-sectional views of finite element analysis models used in Example 1.
Figure 11:
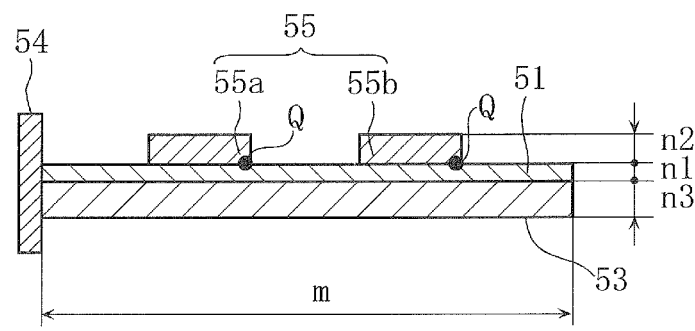
Figure 11:
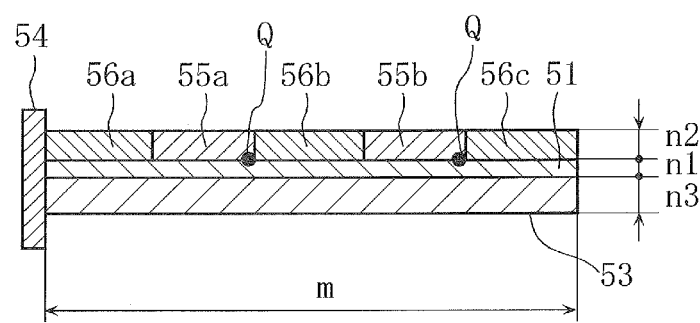
Figure 12:
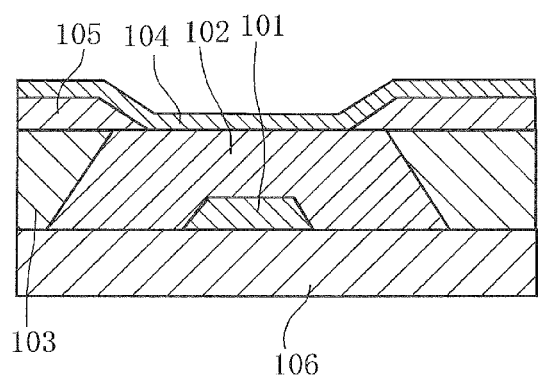
FIG. 12 is a cross-sectional view of a main portion of a piezoelectric device described in Patent Document 1.
Figure 13:
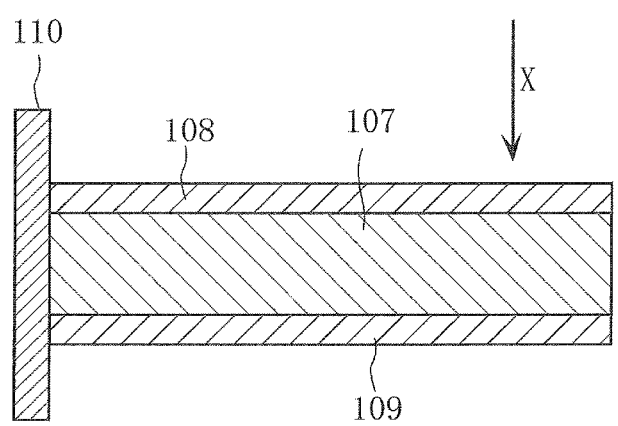
FIG. 13 is a cross-sectional view schematically showing a sintered body in which first and second conductor portions are disposed on both principal surfaces of a piezoelectric ceramic base body.
Figure 14:
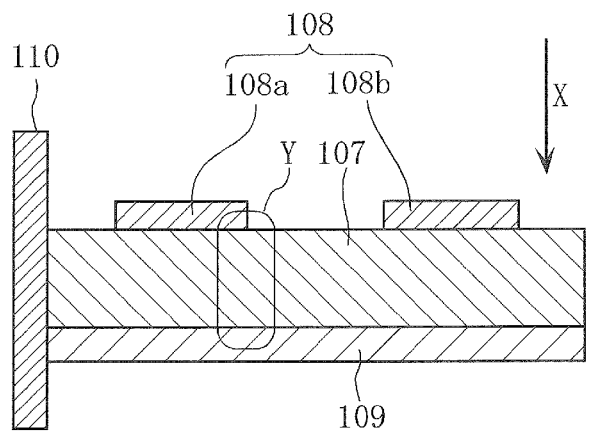
FIG. 14 is a cross-sectional view illustrating a problem in the case where a first conductor portion is subjected to a patterning process.
Figure 15:
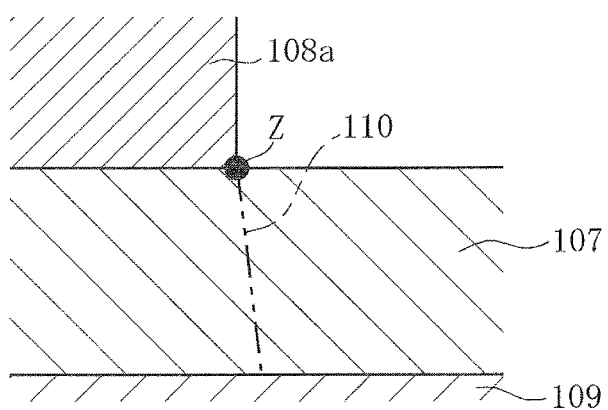
FIG. 15 is an enlarged cross-sectional view of a region Y of FIG. 14.

Model 0 is an analytical model according to a reference example. As shown in FIG. 11, part (a), first and second conductor portions 52 and 53 composed of Ni (Young's modulus: 201 GPa) are disposed entirely on both principal surfaces of a piezoelectric ceramic base body 51. One end is fixed to a support plate 54, with the other end being a free end. The length m of the piezoelectric ceramic base body 51 is 1 mm and the thickness n1 thereof is 1 μm. The thickness n2 of the first conductor portion 52 and the thickness n3 of the second conductor portion 53 are each 2 μm.

Model 1 is an analytical model outside the scope of the present invention. As shown in FIG. 11, part (b), two conductive films 55a and 55b, which are composed of Ni and separate from each other and which have a thickness n2 of 2 μm, are disposed on one principal surface of a piezoelectric ceramic base body 51. Furthermore, as in Model 0, a second conductor portion 53 is disposed entirely on the other principal surface of the piezoelectric ceramic base body 51. In Model 1, one end is also fixed to a support plate 54, with the other end being a free end.

In Model 2, as shown in FIG. 11, part (c), in addition to the structure of Model 1, insulating films 56a to 56c (Young's modulus: 0.5 to 210 GPa) are disposed on portions of the piezoelectric ceramic base body 1 not covered with conductive films 55a and 55b.

Each of the analytical models (Models 0 to 2) was broken down into elements in a matrix form. The Young's moduli of Ni (conductive films) and the insulating film, shape data, and constraint condition (the most distant point from the fixed end on the lower side of the conductor portion 53) were inputted, and on the basis of the input data, the reaction force (reaction force at the constraint point) and the maximum stress in each of the piezoelectric ceramic base body 51 and the insulating films 56a to 56c were calculated by the finite element method for each analytical model.

Table 1 shows the analysis results for Models 0 to 2.

TABLE 1

| No. | Model | Young's modulus (GPa) | | Reaction force (N) | Maximum stress (MPa) | |
|---|---|---|---|---|---|---|
| | | Ni | Epoxy resin | | Piezoelectric ceramic | Insulating film (Epoxy resin) |
| 1* | 1 | 201 | — | $2.44 \times 10^{-5}$ | 23.1 | — |
| 2 | 2 | 201 | 0.5 | $2.48 \times 10^{-5}$ | 22.6 | 0.307 |
| 3 | 2 | 201 | 1.0 | $2.52 \times 10^{-5}$ | 22.0 | 0.597 |
| 4 | 2 | 201 | 50 | $4.84 \times 10^{-5}$ | 5.55 | 7.83 |
| 5 | 2 | 201 | 100 | $5.91 \times 10^{-5}$ | 3.45 | 11.8 |
| 6 | 2 | 201 | 150 | $6.52 \times 10^{-5}$ | 2.72 | 14.5 |
| 7 | 2 | 201 | 201 | $6.93 \times 10^{-5}$ | 1.75 | 16.5 |
| 8* | 2 | 201 | 210 | $6.99 \times 10^{-5}$ | 1.78 | 16.8 |
| 9** | 0 | 201 | — | $6.93 \times 10^{-5}$ | 3.8 | — |

*Outside the scope of the present invention
**Reference example

In No. 9 (Model 0), the reaction force was $6.93 \times 10^{-5}$ N. Furthermore, the maximum stress in the piezoelectric ceramic base body 51, which occurred at a point P in the vicinity of the fixed end shown in FIG. 11, part (a), was low at 3.8 MPa. That is, the maximum stress is low at 3.8 MPa, and thus, it has become clear that, even when an external force is applied, structural defects, such as cracks and interlayer separation, are unlikely to occur.

In No. 1 (Model 1), portions of the first conductor portions 55 were removed and portions of the surface of the piezoelectric ceramic base body 51 were exposed. Therefore, rigidity was low, and the reaction force was $2.44 \times 10^{-5}$ N, which was lower than that of No. 9 (Model 0).

However, a large amount of stress occurred at contact points Q between the piezoelectric ceramic base body 51 and corner portions of the conductive films 55a and 55b, and the maximum stress in the piezoelectric ceramic base body 51 increased to 23.1 MPa (refer to FIG. 11, part (b)). That is, in No. 1 (Model 1), the maximum stress increases greatly compared with No. 9. It is considered that, when an external force is applied, stress concentrates on the points Q, and structural defects, such as cracks, easily occur.

On the other hand, in Nos. 2 to 7 (Model 2), since the insulating films 56a to 56c were disposed on portions of the piezoelectric ceramic base body 51 not covered with the conductive films 55a and 55b, rigidity increased and the reaction force increased compared with Model 1 (No. 2). However, although the maximum stress is exhibited in the vicinity of contact points Q shown in FIG. 11, part (c), the maximum stress in the piezoelectric ceramic base body 51 is low compared with Model 1 (No. 1), and the maximum stress of the insulating films 56a to 56c can be suppressed. Thus, it has become clear that stress concentration can be relieved.

In particular, in Nos. 2 and 3, the Young's modulus of the insulating films 56a to 56c is low at 0.5 GPa and 1.0 GPa, indicating excellent malleability, and therefore, the maximum stress of the insulating films 56a to 56c is low at 0.307 MPa and 0.597 MPa, respectively. Thus, it has become clear that stress concentration hardly occurs.

Furthermore, as is evident from the analysis results of Nos. 2 to 7, since malleability decreases with the increasing Young's modulus, rigidity increases, the reaction force increases, and the maximum stress of the insulating films 56a to 56c tends to increase. However, the maximum stress of the piezoelectric ceramic base body 51 decreases.

Furthermore, in No. 8 (Model 2), as in Nos. 2 to 7, the insulating films 56a to 56c are disposed on portions of the piezoelectric ceramic base body 51 not covered with the conductive films 55a and 55b. However, the Young's modulus of the insulating films 56a to 56c is higher than the Young's modulus (=201 GPa) of Ni serving as the conductive films 55a and 55b. Accordingly, the malleability of the insulating films 56a to 56c is lower than the malleability of the conductive films 55a and 55b, and therefore, the maximum stress in each of the piezoelectric ceramic base body 51 and the insulating films 56a to 56c tends to increase. Rigidity increases, and the reaction force becomes higher than the conductive films 55a and 55b. Therefore, there is a concern that degradation in operation performance may be caused.

That is, even in the case of Model 2, as in Nos. 2 to 7, it is necessary to set the Young's modulus of the insulating films 56a to 56c to be equal to or less than the Young's modulus of the conductive films 55a and 55b.

Example 2

(Fabrication of Sample)

As ceramic raw materials, $K_2CO_3$, $Na_2CO_3$, $Li_2CO_3$, $Nb_2O_5$, $CaCO_3$, $ZrO_2$, $MnCO_3$, and $Yb_2O_3$ were prepared.

Subsequently, the ceramic raw materials were weighed such that the composition formula [100{0.98$(K_{0.45}Na_{0.53}Li_{0.02})NbO_3$-0.02$CaZrO_3$}+3$ZrO_2$+5MnO+0.5$YbO_{1.5}$] was satisfied.

Subsequently, the weighted materials were fed into a pot mill containing PSZ balls, and by using ethanol as a solvent, wet-mixing and pulverization were performed while rotating the pot mill for about 90 hours. After the resulting mixture was dried, calcination was performed at a temperature of 900° C. Thereby, a ceramic raw material powder represented by the composition formula was obtained.

Next, after being disintegrated, the ceramic raw material powder was fed into a pot mill containing PSZ balls, together with an organic binder, acetone as an organic solvent, a dispersant, and a plasticizer. Wet-mixing and pulverization were performed thoroughly while rotating the pot mill, thereby to obtain a ceramic slurry. Subsequently, by using a doctor blade method, the ceramic slurry was subjected to a forming process such that the thickness after firing was 15 μm. Thereby, a piezoelectric ceramic sheet was formed.

Furthermore, a Ni powder having a Young's modulus of 201 GPs was prepared. The Ni powder, together with an organic binder, acetone as an organic solvent, a dispersant, and a plasticizer, was fed into a pot mill containing PSZ balls. Wet-mixing was performed thoroughly while rotating the pot mill, thereby to obtain a conductive slurry. Then, by using a doctor blade method, the conductive slurry was subjected to a forming process such that the thickness after firing was 2 μm. Thereby, conductive sheets were obtained.

Next, the piezoelectric ceramic sheet was sandwiched between a pair of conductive sheets so as to form a multilayer body, and the multilayer body was subjected to hydrostatic pressing. Then, firing was performed for 2 hours, at a temperature of 1,000° C. to 1,160° C., in a reducing atmosphere in which the oxygen partial pressure was adjusted to the reduction side by 0.5 orders of magnitude from the equilibrium oxygen partial pressure of Ni—NiO such that Ni was not oxidized. Thereby, a co-sintered body in which first and second conductor portions were disposed on both principal surfaces of a piezoelectric ceramic base body was obtained.

Subsequently, by using a photolithographic technique, the first conductor portion was processed to form four conductive films having a predetermined pattern.

That is, after a photoresist was applied to a surface of the first conductor portion, prebaking was performed. Then, a mask having a predetermined pattern was placed above the photoresist, and exposure was performed by ultraviolet light irradiation so that the mask pattern was transferred to the photoresist. Next, after development was performed, washing was performed with pure water. Then, wet etching was performed by immersing the workpiece in a ferric chloride solution as an etching solution. Thereby, four conductive films having a predetermined pattern were formed. Thus, a sintered body was obtained.

Next, an insulating film composed of an epoxy resin having a Young's modulus of 3 GPa was formed on the piezoelectric ceramic base body and the conductive films such that portions of the conductive films were exposed.

That is, an epoxy solution containing a photosensitive epoxy resin was applied by spin coating onto the piezoelectric ceramic base body and the conductive films, followed by prebaking. Exposure was performed with a mask having a predetermined pattern interposed, followed by development. Subsequently, by performing post baking, an insulating film from which portions of the conductive films, i.e., exposed surfaces, were exposed was formed. The thickness of the insulating film from the surface of the piezoelectric ceramic base body was about 2.4 μm.

Subsequently, by using a sputtering method, a conductive layer composed of an alloy made of nickel and copper with a thickness of about 1.9 μm was formed on the sintered body covered with the insulating film. Then, by using the photolithographic technique, extended electrode layers having a predetermined pattern were formed.

Next, a conductive layer composed of Ni and Au was formed on the surfaces of the extended electrode layers. Then, by using the photolithographic technique, line electrode layers were formed in a land shape at predetermined positions on the extended electrodes. Thereby, a sample of Example 2 was fabricated.

(Evaluation of Sample)

A cross section of the sample was observed with an SEM, and it was confirmed that there were no cracks or interlayer separation. That is, in this sample, it has become clear that although the piezoelectric ceramic base body has a thickness of 15 μm, thus being very thin with a thickness of 90 μm or less, a desired sintered body can be obtained; and that even when a load is applied in the manufacturing process, occurrence of structural defects, such as cracks and interlayer separation, can be suppressed, and it is possible to obtain a piezoelectric device having good mechanical strength and good processability.

Furthermore, the thickness ts of the insulating film is 2.4 μm, and the thickness tm of the conductive films is 2 μm. Therefore, $(ts/tm)^3$ is 1.73. On the other hand, the Young's modulus Es of the insulating film is 3 GPa, and the Young's modulus of Ni constituting the conductive films is 201 GPa. Therefore, (Em/Es) is 67, and the relationship $(ts/tm)^3$<(Em/Es) is established.

That is, it has become clear that even when the thickness of the insulating film increases, by selecting an insulating material having an appropriate Young's modulus, an increase in rigidity can be suppressed, and degradation in operation performance of a piezoelectric device can be avoided.

Example 3

(Fabrication of Sample)

By the same method and procedure as those of Example 2, piezoelectric ceramic sheets having a thickness (after firing) of 90 μm and conductive sheets having a thickness (after firing) of 2 μm were formed. Six multilayer bodies, each including a piezoelectric ceramic sheet sandwiched between a pair of conductive sheets, were stacked, and then, by the same method and procedure as those of Example 2, a sample of Example 3 was fabricated.

(Evaluation of Sample)

A cross section of the sample was observed with an SEM, and it was confirmed that there were no cracks or interlayer separation. That is, in this sample, it has been confirmed that although the piezoelectric ceramic base body has a thickness of 90 μm, thus being very thin, a desired sintered body can be obtained as in Example 2; and that even when a load is applied in the manufacturing process, occurrence of structural defects, such as cracks and interlayer separation, can be suppressed, and it is possible to obtain a piezoelectric device having good mechanical strength and good processability.

Furthermore, in this sample, as in Example 2, the thickness ts of the insulating film is 2.4 μm, and the thickness tm of the conductive films is 2 μm. Therefore, $(ts/tm)^3$ is 1.73. On the other hand, the Young's modulus Es of the insulating film is 3 GPa, and the Young's modulus of Ni constituting the conductive films is 201 GPa. Therefore, (Em/Es) is 67, and the relationship $(ts/tm)^3<(Em/Es)$ is of course established.

Example 4

(Fabrication of Sample)

By the same method and procedure as those of Example 2, a piezoelectric ceramic sheet having a thickness (after firing) of 4 μm and conductive sheets having a thickness (after firing) of 2 μm were formed. The piezoelectric ceramic sheet was sandwiched between a pair of conductive sheets so as to form a multilayer body. Thereafter, by the same method and procedure as those of Example 2, a sample of Example 4 was fabricated.

(Evaluation of Sample)

A cross section of the sample was observed with an SEM, and it was confirmed that there were no cracks or interlayer separation. That is, in this sample, it has been confirmed that although the piezoelectric ceramic base body has a thickness of 4 μm, thus being very thin with a thickness of 90 μm or less, a desired sintered body can be obtained as in Example 2; and that even when a load is applied in the manufacturing process, occurrence of structural defects, such as cracks and interlayer separation, can be suppressed, and it is possible to obtain a piezoelectric device having good mechanical strength and good processability.

Furthermore, in this sample, as in Examples 2 and 3, the thickness ts of the insulating film is 2.4 μm, and the thickness tm of the conductive films is 2 μm. Therefore, $(ts/tm)^3$ is 1.73. On the other hand, the Young's modulus Es of the insulating film is 3 GPa, and the Young's modulus of Ni constituting the conductive films is 201 GPa. Therefore, (Em/Es) is 67, and the relationship $(ts/tm)^3<(Em/Es)$ is of course established.

It is possible to realize a thin piezoelectric device which can suppress occurrence of structural defects, such as cracks and interlayer separation, even when an external force is applied, which does not cause degradation in operation performance, and which has good mechanical strength and good processability.

REFERENCE SIGNS LIST 1 piezoelectric ceramic base body
2 first conductor portion (conductor portion)
2a, 2b conductive film
3 second conductor portion (conductor portion)
4 sintered body
5 insulating film
7a, 7b outer electrode
13 piezoelectric ceramic sheet
14a first conductive sheet (conductive material)
14b second conductive sheet (conductive material)
21 piezoelectric ceramic base body
22 internal conductor
38 piezoelectric ceramic sheet
39 piezoelectric ceramic sheet
40 conductive sheet
41 conductive sheet
42 conductive sheet
47 multilayer body

The invention claimed is:

1. A piezoelectric device comprising:
a sintered body having:
a piezoelectric ceramic base body with first and second principal surfaces;
a first conductor on the first principal surface, the first conductor including a plurality of conductive films having a predetermined pattern, the plurality of conductive films being separate from each other, and each of the plurality of conductive films being on the first principal surface of the piezoelectric ceramic base body; and
a single second conductor on the second principal surface; and
an insulating film on the first principal surface of the piezoelectric ceramic base body and disposed such that at least portions of the plurality of conductive films are exposed therethrough,
wherein the insulating film has a malleability equal to or greater than that of the plurality of conductive films.

2. The piezoelectric device according to claim 1, wherein the insulating film has a Young's modulus equal to or less than that of the conductive films.

3. The piezoelectric device according to claim 2, wherein $(ts/tm)^3<Em/Es$, where ts is an average thickness of the insulating film, tm is an average thickness of the conductive films, Es is a Young's modulus of the insulating film, and Em is a Young's modulus of the plurality of conductive films.

4. The piezoelectric device according to claim 1, wherein $(ts/tm)^3<Em/Es$, where ts is an average thickness of the insulating film, tm is an average thickness of the conductive films, Es is a Young's modulus of the insulating film, and Em is a Young's modulus of the plurality of conductive films.

5. The piezoelectric device according to claim 1, wherein the piezoelectric ceramic base body has an average thickness of 90 μm or less.

6. The piezoelectric device according to claim 5, wherein the piezoelectric ceramic base body has an average thickness of 4 μm to 90 μm.

7. The piezoelectric device according to claim 1, wherein the piezoelectric ceramic base body has a multilayer structure including an internal conductor.

8. The piezoelectric device according to claim 1, wherein the insulating film contains an organic compound as a main component.

9. The piezoelectric device according to claim 1, wherein the piezoelectric ceramic base body contains a perovskite-type compound containing at least niobium and an alkali metal element.

10. The piezoelectric device according to claim 1, wherein the first conductor and the second conductor contain a non-precious metal material.

11. The piezoelectric device according to claim 1, further comprising a plurality of electrode layers, each of which being respectively disposed on the portion of each of the plurality of conductive films exposed through the insulating film.

12. A method for manufacturing a piezoelectric device, the method comprising:
firing a body that includes a piezoelectric ceramic sheet having first and second main surfaces, a first conductive material on the first main surface and a second conductive material on the second main surface to form a sintered body having a piezoelectric ceramic base body with a first principal surface and a second principal surface, a first conductor portion on the first principal surface and a single second conductor portion on the second principal surface;

patterning the first conductor portion into a plurality of conductive films, the plurality of conductive films being separate from each other, and each of the plurality of conductive films being on the first principal surface of the piezoelectric ceramic base body; and applying an insulating material onto the piezoelectric ceramic base body such that at least portions of the plurality of conductive films are exposed therethrough so as to form an insulating film, the insulating film having a malleability equal to or greater than that of the plurality of conductive films.

13. The method for manufacturing a piezoelectric device according to claim 12, wherein the insulating film has a Young's modulus equal to or less than that of the plurality of conductive films.

14. The method for manufacturing a piezoelectric device according to claim 12, wherein the insulating material is composed of an organic compound.

15. The method for manufacturing a piezoelectric device according to claim 12, further comprising forming a respective electrode layer on each of the portions of the plurality of conductive films that are exposed through the insulating material.

16. The method for manufacturing a piezoelectric device according to claim 12, wherein $(ts/tm)^3 < Em/Es$, where ts is an average thickness of the insulating film, tm is an average thickness of the plurality of conductive films, Es is a Young's modulus of the insulating film, and Em is a Young's modulus of the plurality of conductive films.

17. The method for manufacturing a piezoelectric device according to claim 12, wherein the piezoelectric ceramic base body has an average thickness of 90 μm or less.

18. The method for manufacturing a piezoelectric device according to claim 17, wherein the piezoelectric ceramic base body has an average thickness of 4 μm to 90 μm.

19. The method for manufacturing a piezoelectric device according to claim 12, wherein the piezoelectric ceramic base body has a multilayer structure including an internal conductor.

20. The method for manufacturing a piezoelectric device according to claim 12, wherein the piezoelectric ceramic base body contains a perovskite-type compound containing at least niobium and an alkali metal element.

* * * * *